(12) United States Patent
Cai et al.

(10) Patent No.: US 9,548,762 B2
(45) Date of Patent: Jan. 17, 2017

(54) NORMALIZATION FACTOR ADAPTATION FOR LDPC DECODING FOR HARD DISK DRIVE SYSTEMS

(71) Applicant: Agency for Science, Technology and Research, Singapore (SG)

(72) Inventors: Kui Cai, Singapore (SG); Yibin Ng, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 161 days.

(21) Appl. No.: 14/508,983

(22) Filed: Oct. 7, 2014

(65) Prior Publication Data

US 2015/0100855 A1 Apr. 9, 2015

(30) Foreign Application Priority Data

Oct. 7, 2013 (SG) ............................. 201307500-7

(51) Int. Cl.
*H03M 13/00* (2006.01)
*H03M 13/35* (2006.01)
(Continued)

(52) U.S. Cl.
CPC ........ *H03M 13/353* (2013.01); *G06F 11/1076* (2013.01); *G11B 20/1833* (2013.01);
(Continued)

(58) Field of Classification Search
CPC ................. G11B 20/1833; G11B 2020/185; G11B 5/3909; G11B 5/3945; G11B 5/235; G11B 5/3106; G11B 5/3146; G11B 5/3967; G11B 2005/0024; G11B 5/02; G11B 5/607; G11B 2005/001; H03M 13/353; H03M 13/6343; H03M 13/1111; H03M 13/1117; H03M 13/1102; G06F 11/1076; Y10T 428/1121; Y10T 428/1171

See application file for complete search history.

(56) References Cited

U.S. PATENT DOCUMENTS 8,136,016 B1 *  3/2012  Wu ................... G11B 20/10046
                                                 714/769
8,281,212 B1 * 10/2012  Yeung ................ H03M 13/1102
                                                 714/755

(Continued)

*Primary Examiner* — Guerrier Merant
(74) *Attorney, Agent, or Firm* — Blakely, Sokoloff, Taylor & Zafman LLP

(57) ABSTRACT

An adaptation technique for decoding low-density parity-check (LDPC) codes for hard disk drive (HDDs) systems is disclosed. The method includes tuning the normalization factor for LDPC decoding for each data zone and read head during the test stage of manufacturing. The LDPC decoder can be either a sum-product algorithm (SPA) decoder or a Min-Sum decoder. The channel detector can be any soft-output detector, such as a soft-output Viterbit detector (SOVA), a BCJR detector, a pattern-dependent noise-predictive (PDNP) detector, or a bi-directional pattern-dependent noise-predictive (BiPDNP) detector. The adaptation technique can optimize the LDPC decoding performance for each data zone and read head, thereby relaxing the acceptance criteria for hard disk drive read/write heads and disk media, enabling acceptance and use of a much broader range of head and media for hard disk drives.

16 Claims, 7 Drawing Sheets

(51) Int. Cl.
  H03M 13/11    (2006.01)
  G06F 11/10    (2006.01)
  G11B 20/18    (2006.01)

(52) U.S. Cl.
  CPC .... H03M 13/1102 (2013.01); H03M 13/1111 (2013.01); H03M 13/1117 (2013.01); H03M 13/6343 (2013.01); *G11B 2020/185* (2013.01)

(56) References Cited

U.S. PATENT DOCUMENTS

| | | | | |
|---|---|---|---|---|
| 8,908,307 B1 * | 12/2014 | Yang | ................... | G11B 20/1833 360/39 |
| 9,214,963 B1 * | 12/2015 | Garani | ............. | H03M 13/2906 |
| 2009/0045989 A1 * | 2/2009 | Esumi | .............. | G11B 20/10009 341/58 |
| 2011/0047442 A1 * | 2/2011 | Dave | ................... | G06F 11/1068 714/773 |
| 2011/0320915 A1 * | 12/2011 | Khan | .................... | G06F 3/0608 714/773 |
| 2012/0144272 A1 * | 6/2012 | Franceschini | ....... | G06F 11/1012 714/773 |
| 2013/0279039 A1 * | 10/2013 | Shiroishi | ............ | G11B 20/1217 360/48 |
| 2013/0297988 A1 * | 11/2013 | Wu | ..................... | G06F 11/1068 714/773 |
| 2013/0335847 A1 * | 12/2013 | Shiroishi | ................. | G11B 5/02 360/46 |
| 2014/0063648 A1 * | 3/2014 | Shiroishi | .............. | G11B 5/3909 360/75 |
| 2014/0104720 A1 * | 4/2014 | Zhang | ................... | G11B 5/012 360/53 |
| 2014/0201590 A1 * | 7/2014 | Coker | ............... | G11B 20/1217 714/758 |
| 2015/0089317 A1 * | 3/2015 | Patapoutian | ....... | G11B 20/1833 714/755 |
| 2015/0149855 A1 * | 5/2015 | Alhussien | ........... | G06F 11/1012 714/758 |

* cited by examiner

US 9,548,762 B2

NORMALIZATION FACTOR ADAPTATION FOR LDPC DECODING FOR HARD DISK DRIVE SYSTEMS

PRIORITY CLAIM

The present application claims priority to Singapore Patent Application No. 201307500-7, filed 7 Oct. 2013.

FIELD OF INVENTION

The present invention relates to coding and signal processing for storing and retrieving stored information for hard disk drives.

BACKGROUND OF THE DISCLOSURE

Hard disk drives employ a technique called zoned bit recording (ZBR) for storing information on the disk media. ZBR is a technique where recording tracks are grouped into zones based on their distance from the center of the disk and each zone is assigned a number of sectors per track. In practice, the disk media characteristics differ from one data zone to another and each read head also has its unique response to the recorded data. In addition, no two disks are alike. As a result, the signal-to-noise ratio (SNR) of the signals read back from the head typically varies from zone to zone, head to head, and disk to disk. The SNR may also vary with temperature and other operational parameters. Therefore, the read channel is expected to be optimized for each disk, and for each zone and head.

In conventional disk drive systems, adaptive equalization techniques have been applied in order to take into account the variations between data zones, read heads, and disks. For example, during the test stage of manufacturing, the equalizer coefficients are trained or optimized based on known pseudo-random data recorded on the corresponding data zone. This process is repeated for each data zone and each head and the obtained equalizer coefficients are cached in RAM and stored at "a reserved area" on the disk or in a flash memory. During data detection, the microcontroller retrieves the equalizer coefficients for each data zone and head, and uploads them into the equalizer. In this way, the performance of the equalizer and channel detector can be optimized for each data zone and read head. However, up till now, the error correction codes (ECCs) such as the LDPC codes used for hard disk drives are fixed across the disk media. However, these fixed ECCs cannot take into account the variations in zones and disk heads.

Thus what is needed is a method for deriving error correction codes (ECCs) for data detection optimized for each zone and head, which can provide improved data recovery accuracy. Furthermore, other desirable features and characteristics will become apparent from the subsequent detailed description and the appended claims, taken in conjunction with the accompanying drawings and this background of the disclosure.

SUMMARY OF THE INVENTION

A method for adapting low-density parity-check (LDPC) codes for a hard disk drive system is disclosed. The method includes a selecting step, a defining step, an introducing step and a repeating step. The selecting step includes selecting a specific zone in the hard disk drive system. The defining step includes defining a normalization factor which reduces a variation of bit error rate for different signal-to-noise ratio (SNR) based on known pseudo-random data pattern for the specific zone. The introducing step includes introducing the normalization factor into the LDPC codes for the specific zone. The repeating step includes repeating the selecting step, defining step and introducing step for each zone in the hard disk drive system.

A method for adapting low-demi parity-check (LDPC) codes for hard disk drive systems is disclosed. The method includes selecting a read head of the hard disk drive systems. The method further includes defining a normalization factor which reduces a variation of bit error rate for different signal-to-noise ratio (SNR) based on known pseudo-random data pattern for the read head and introducing the normalization factor into the LDPC codes for the read head. Additionally, the method includes repeating the selecting step, defining step and introducing step for each read head in the hard disk drive systems.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with the present invention.

Skilled artisans will appreciate that elements in the figures are illustrated for simplicity and clarity and have not necessarily been drawn to scale. For example, the dimensions of some of the elements in the figures illustrating integrated circuit architecture may be exaggerated relative to other elements to help to improve understanding of the present and alternate embodiments.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

An adaptation technique for decoding low-density parity-check (LDPC) codes for hard disk drive (HDDs) systems is proposed which tunes the normalization factor for LDPC decoding for each data zone and read head during the test stage of manufacturing. The LDPC decoder can be either a sum-product algorithm (SPA) decoder or a Min-Sum decoder. The channel detector can be any soft-output detector, such as a soft-output Viterbit detector (SOVA), a BCJR detector a pattern-dependent noise-predictive (PDNP) detector, or a bi-directional pattern-dependent noise-predictive (BiPDNP) detector. The adaptation technique can optimize the LDPC decoding performance for each data zone and read head, thereby relaxing the acceptance criteria for hard disk drive read/write heads and disk media, enabling acceptance and use of a much broader range of head and media for hard disk drives. In addition, in the current disk drives, when errors cannot be corrected by the first-time reading, the drive will carry out a rereading/retry operation. The adaptation technique can also be used during the rereading/retry stage. That is, by tuning the normalization factor to optimize the LDPC decoder during rereading, the decoder may be able to correct the errors which cannot be corrected during the first reading.

Hard disk drives employ a technique called zoned bit recording (ZBR) for storing information on the disk media. ZBR is a technique where recording tracks are grouped into zones based on their distance from the center of the disk and each zone is assigned a number of sectors per track.

Figure 1:
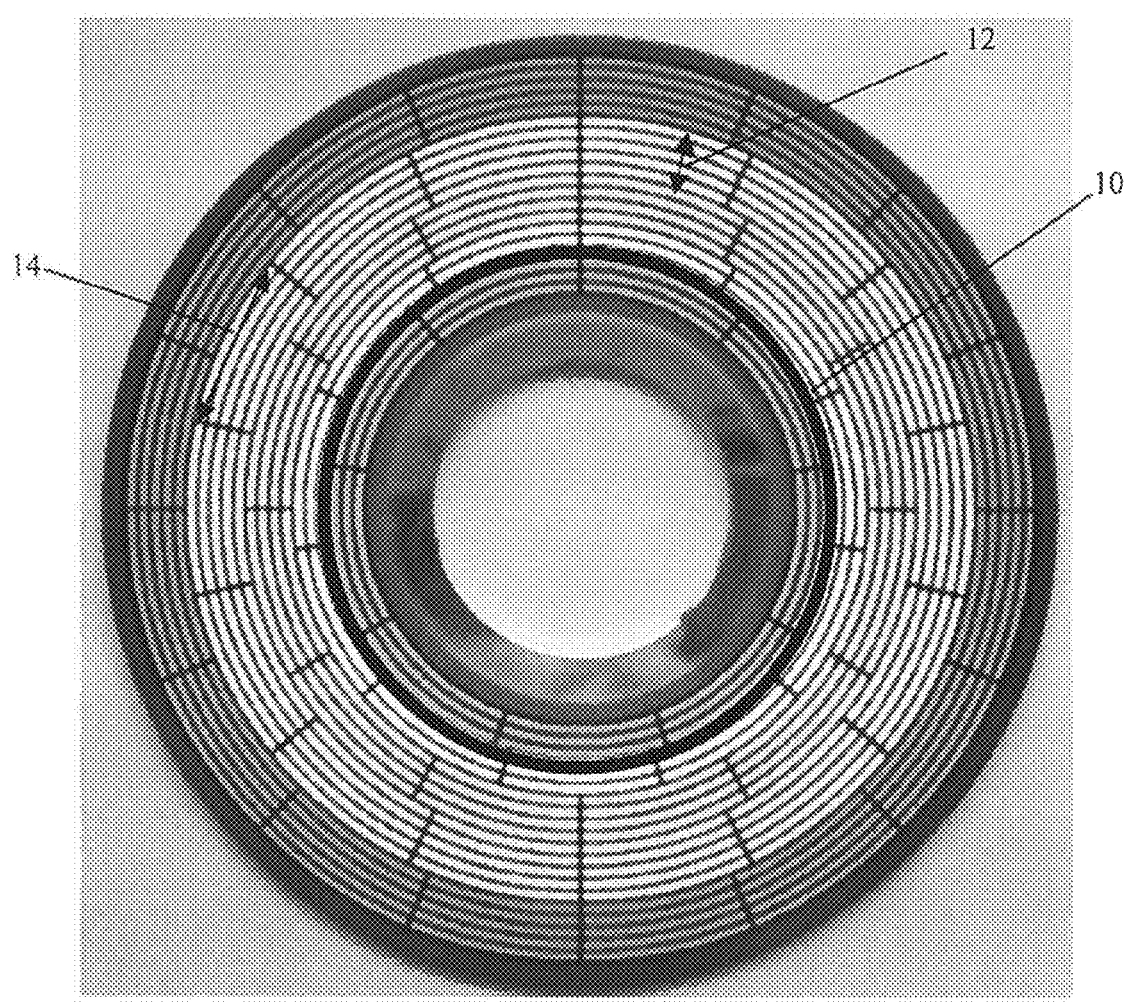
FIG. 1 is a top planar view of disk media showing sectors and tracks in accordance with a present embodiment.

Referring to FIG. 1, a typical disk for hard disk drives is depicted showing the recording tracks 10, zones 12 and sectors 14. No two disks are alike and the disk media characteristics differ from one data zone to another and each read head also has its unique response to the recorded data. As a result, the signal-to-noise ratio (SNR) of the signals read back from the head typically varies from zone to zone, head to head, and disk to disk. The SNR may also vary with temperature and other operational parameters.

Figure 2:
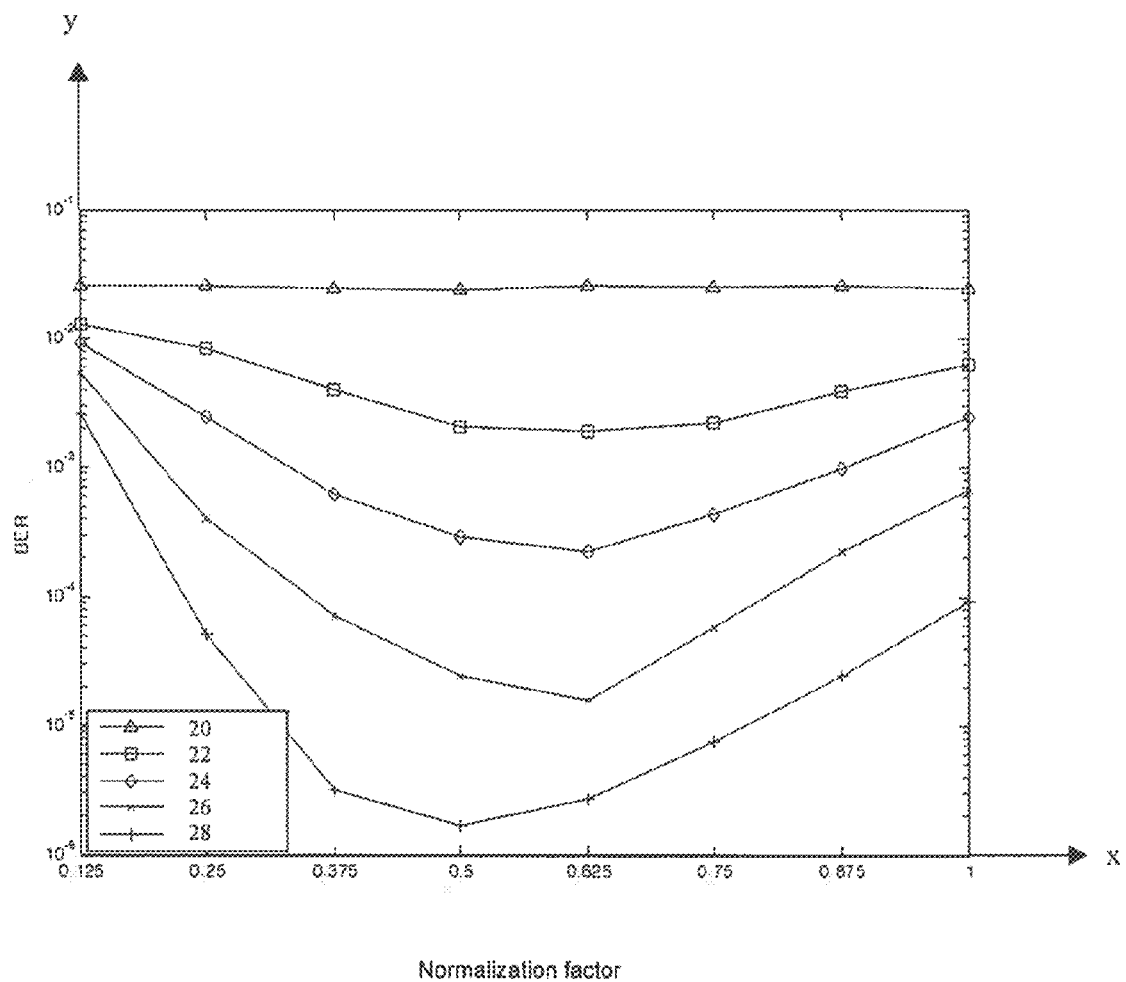
FIG. 2 is a graph of the bit err rate (BER) versus the normalization factor depicting that the optimal normalization factor differs for different signal-to-noise ratios (SNRs) including a normalization factor in accordance with the present embodiment.

FIG. 2 is a graph of the bit err rate (BER) versus the normalization factor for the PR channel. As can be seen from the graph of FIG. 2, the optimal normalization factor differs for different SNRs (20, 22, 24, 26 and 28). Therefore in accordance with the present invention, the operation of the read channel is optimized for each disk, for each zone and for each head by adapting the normalization factor of the low-density parity-check (LDPC) codes for each of the zones and heads. In this manner, by adapting the normalization factor of a LDPC decoder to different data zones/heads, the disk drives' performance will be more robust and greatly improved.

LDPC codes with high code rates have been widely applied in HDDs due to their superior performance over the traditional Reed-Solomon (RS) codes with hard-decision decoding. There are two major types of LDPC decoding algorithms, namely the SPA algorithm, and the Min-Sum algorithm. It is well-known that if the Tanner graph (TG) of the LDPC code is free of cycles, the SPA provides optimal performance and converges to the maximum a posteriori decoding. For such cases, the incoming and outgoing messages across the TO in the SPA are independent. For codes whose TGs have cycles, such as the high rate LDPC codes used in HDDs, there is no guarantee that the SPA is optimal, as the messages passed through the edges of the TG are statistically dependent. As a result, the passed messages would have higher reliability than "real" reliability.

On the other hand, the Min-Sum decoding algorithm is a sub-optimum decoding algorithm, and the sub-optimality comes from overestimation of the message reliabilities. It has been found that introducing a normalization factor $\alpha$ to down scale the message reliabilities can improve the performance of both the SPA decoder and the Min-Sum decoder.

Through simulations, it has been found that optimal normalization factor varies for different SNRs (see FIGS. 3 to 6). Thus, by adapting the normalization factor of the LDPC decoder to different data zones and read heads the disk drives' performance is improved.

During the test stage of manufacturing, after the equalizer coefficients are trained, the normalization factor for LDPC decoding is further tuned to obtain the best error rate performance utilizing a known pseudo-random data pattern written into and read out of specific zones by the read heads.

The normalization factor can be introduced in the check node c, bit node v, or in the channel log-likelihood ratios (LLRs) $LLR_{channel}$. This can be expressed as $$m'_{c \to v} = \alpha \cdot m_{c \to v}, \tag{1}$$

or $$m'_{v \to c} = \alpha \cdot m_{v \to c}. \tag{2}$$

or $$LLR'_{channel} = \alpha \cdot LLR_{channel}. \tag{3}$$

This process is repeated for each data zone and read head and the obtained normalization factors for different zones/heads are cached in RAM then stored into "a reserved area" on the disk or in a flash memory. Thereafter, during read operations, the microcontroller retrieves the normalization factor corresponding to each data zone/head and uploads them into the LDPC decoder when data is read from that zone by that head.

The present embodiment can also be utilized during the rereading/retry stage of HDDs. In the current disk drives, when errors cannot be corrected by the first-time reading, the drive will carry out a rereading/retry operation. By tuning the normalization factor to optimize the LDPC decoder during rereading, the decoder may be able to correct the errors which cannot be corrected during the first reading.

Figure 3:
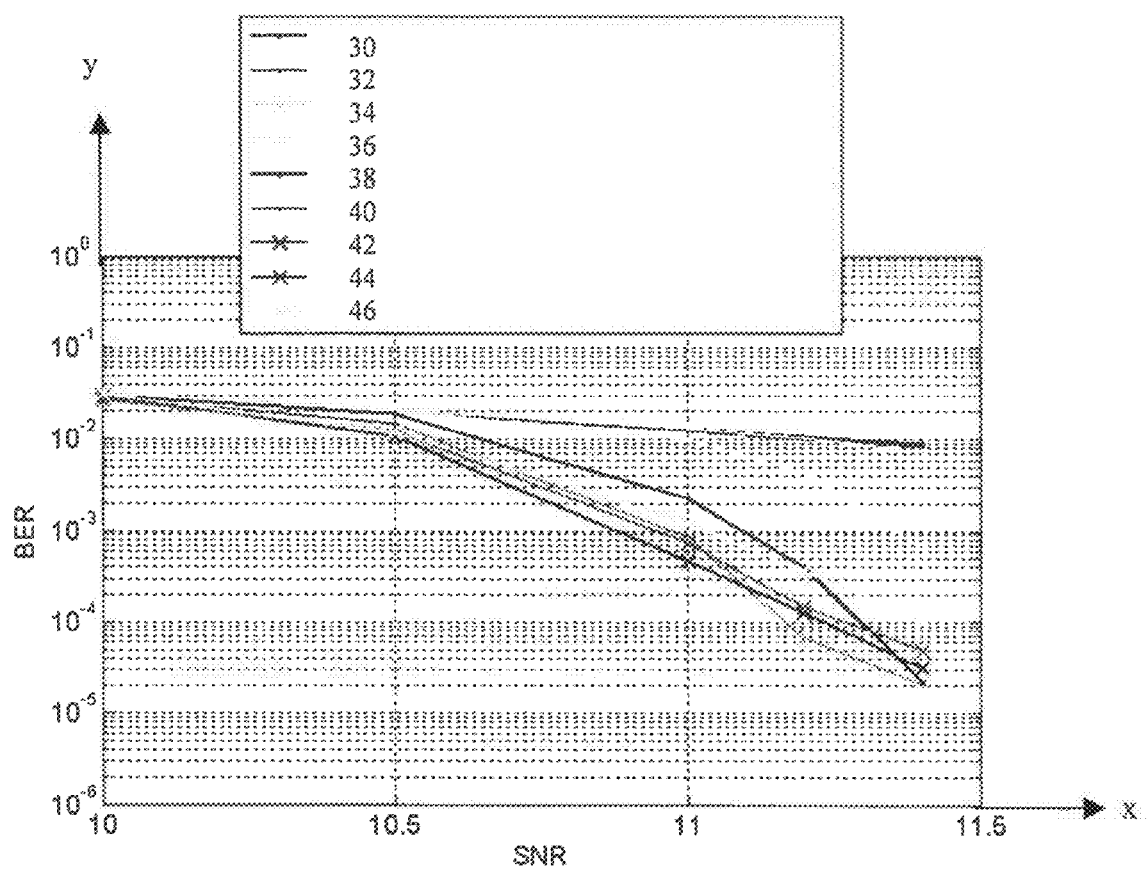
FIG. 3 is a graph showing BER performance of heat-assisted magnetic recording (HAMR) channel with a pattern-dependent noise-predictive (PDNP) detector, with different normalization factors and wherein the jitter noise is 10%, the graph including the normalization factor in accordance with the present embodiment.
Figure 4:
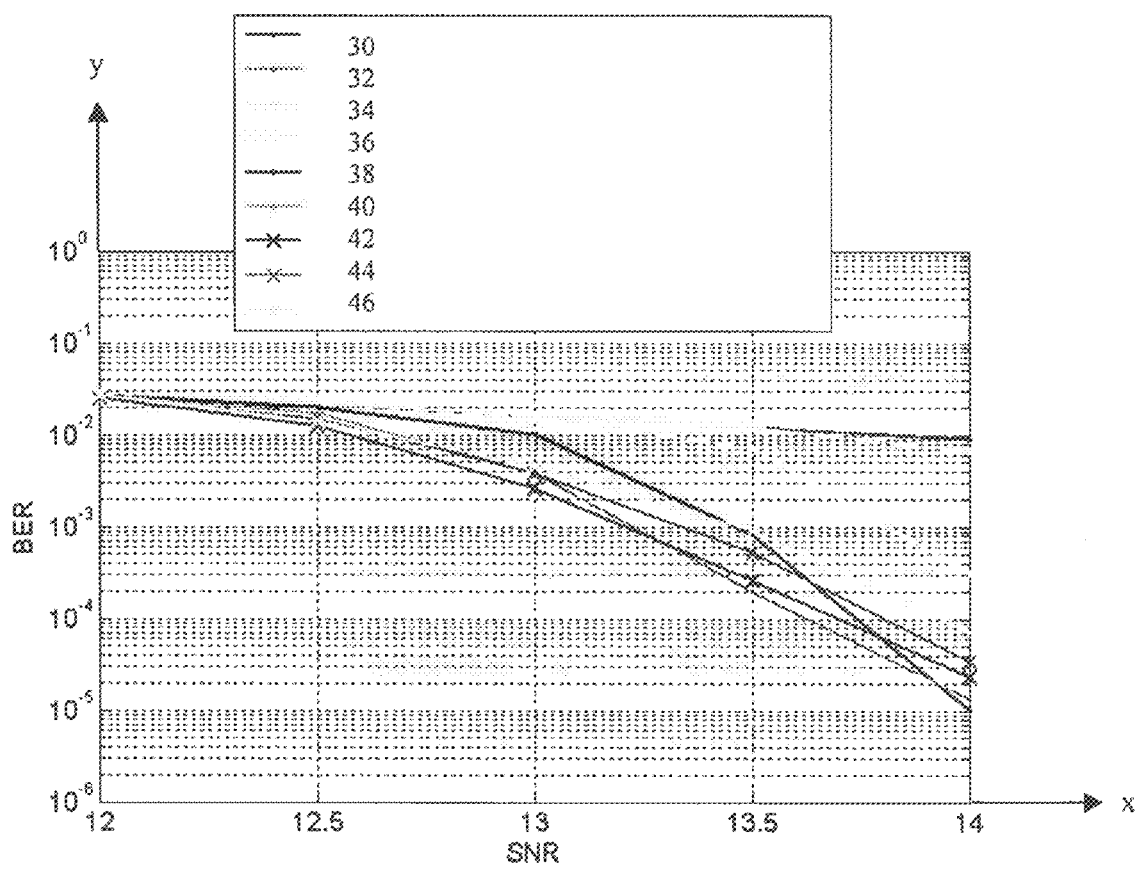
FIG. 4 is a graph showing BER performance of HAMR channel with a PDNP detector, with different normalization factors and wherein the jitter noise is 20%, the graph including the normalization factor in accordance with the present embodiment.
Figure 5:
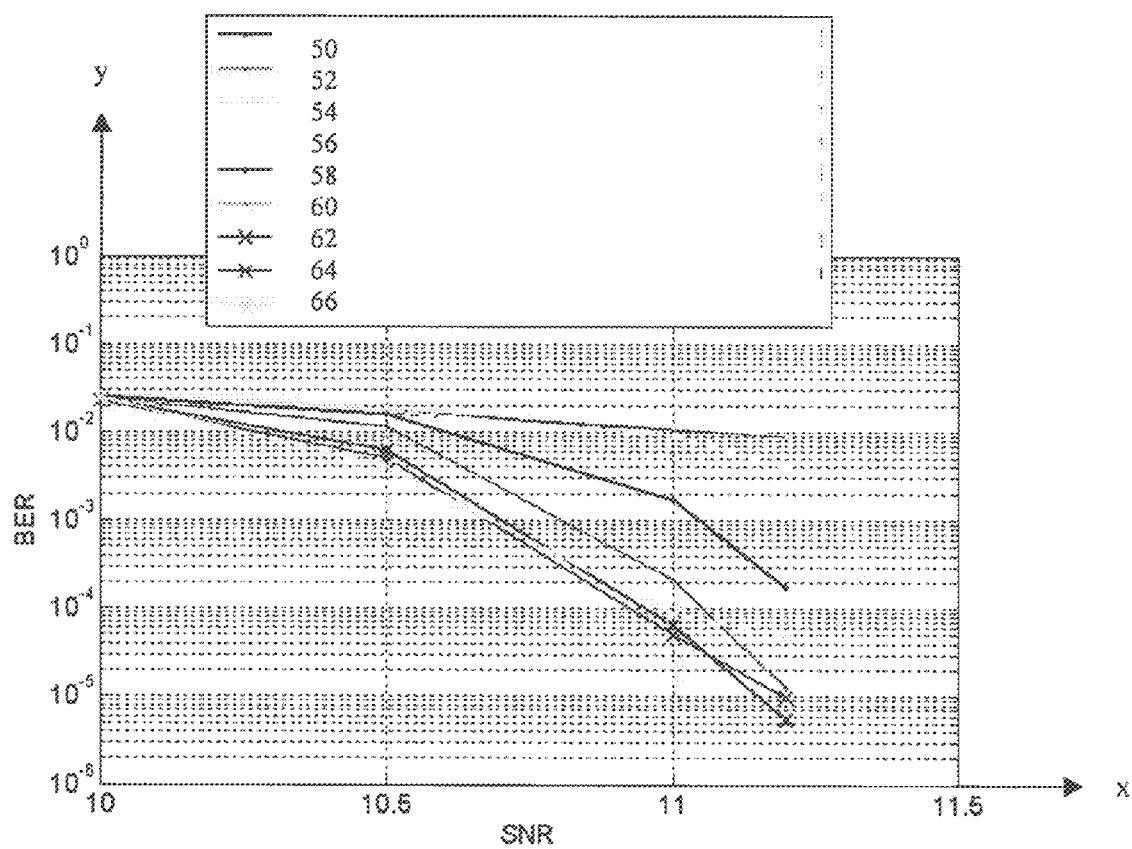
FIG. 5 is a graph showing BER performance of HAMR channel with a bi-directional pattern-dependent noise-predictive (BiPDNP) detector, with different normalization factors and wherein the jitter noise is 10%, the graph including the normalization factor in accordance with the present embodiment.
Figure 6:
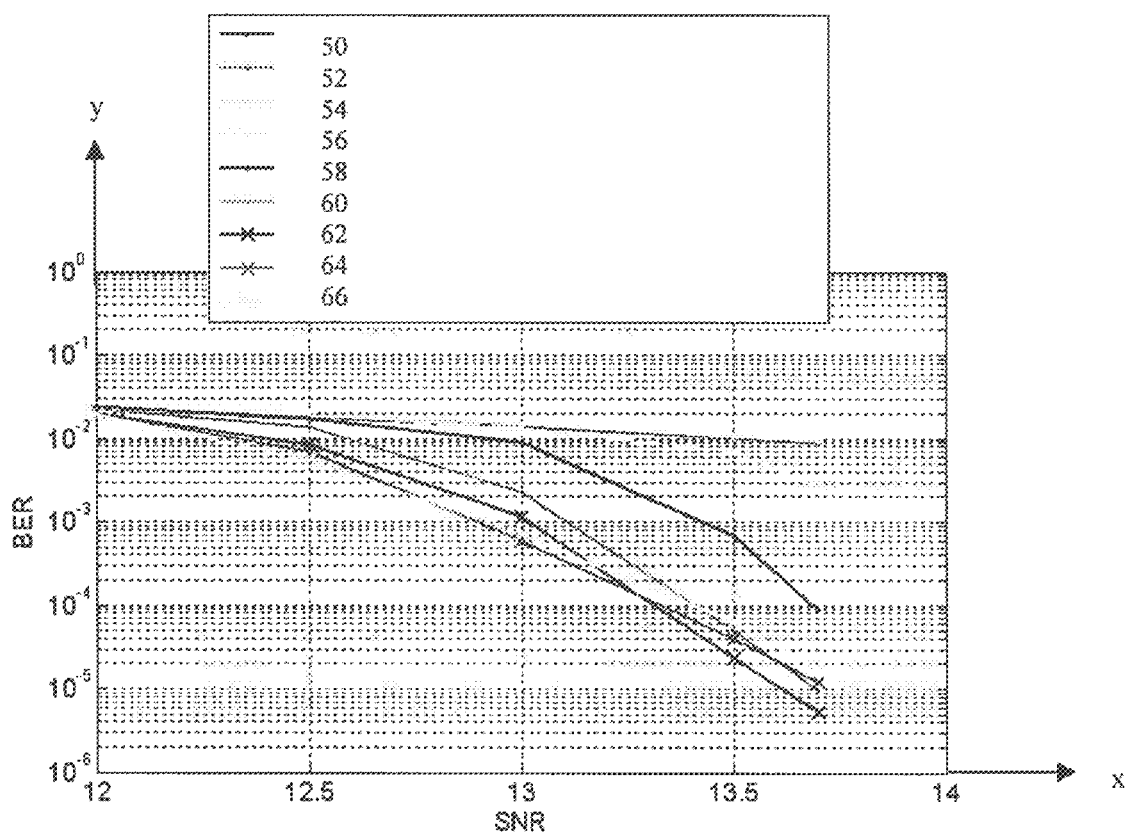
FIG. 6 is a graph showing BER performance of HAMR channel with a BiPDNP detector, with different normalization factors and wherein the jitter noise is 20%, the graph including the normalization factor in accordance with the present embodiment.

The results of computer simulations using a heat-assistant magnetic recording (HAMR) channel to demonstrate the performance gain through normalization factor adaptation are shown in FIGS. 3 to 6. The simulations are carried out for the recording density of 4 Tb/in$^2$, and with 10% and 20% transition jitter noise. In the simulations, two types of channel detectors have been included. In particular, the PDNP detector is the state of the art detector used in the current HDDs, and its performance with LDPC code and with different normalization factor is shown in FIG. 3 and FIG. 4 (30, 32, 34, 36, 38, 40, 42, 44 and 46). The BiPDNP detector is an advanced detector which can achieve a better performance than the PDNP detector, and its performance is shown in FIG. 5 and FIG. 6 (50, 52, 54, 56, 58, 60, 62, 64 and 66).

In accordance with the preferred embodiment, the LDPC code applied is a random LDPC code based on the progressive-edge growth (PEG) with code rate of 0.9358 and column 4. The decoding is performed based on SPA. In the simulations, only the channel $LLR_s$ $LLR_{channel}$ are multiplied with the normalization factor.

From FIGS. 3 to 6, it can be observed that applying different normalization factors during LDPC decoding results in significantly different bit error rate (BER) performance. Furthermore, the normalization factor which leads to the lowest BER varies for different SNRs. Therefore, adapting the normalization factor during the test stage of HDDs can help to optimize the LDPC decoding performance for different data zones and read heads. In addition, the adaptation technique can also be used during the rereading/retry stage of HDDs. By tuning the normalization factor to optimize the LDPC decoder during rereading, the decoder may be able to correct the errors which cannot be corrected during the first reading.

Figure 7:
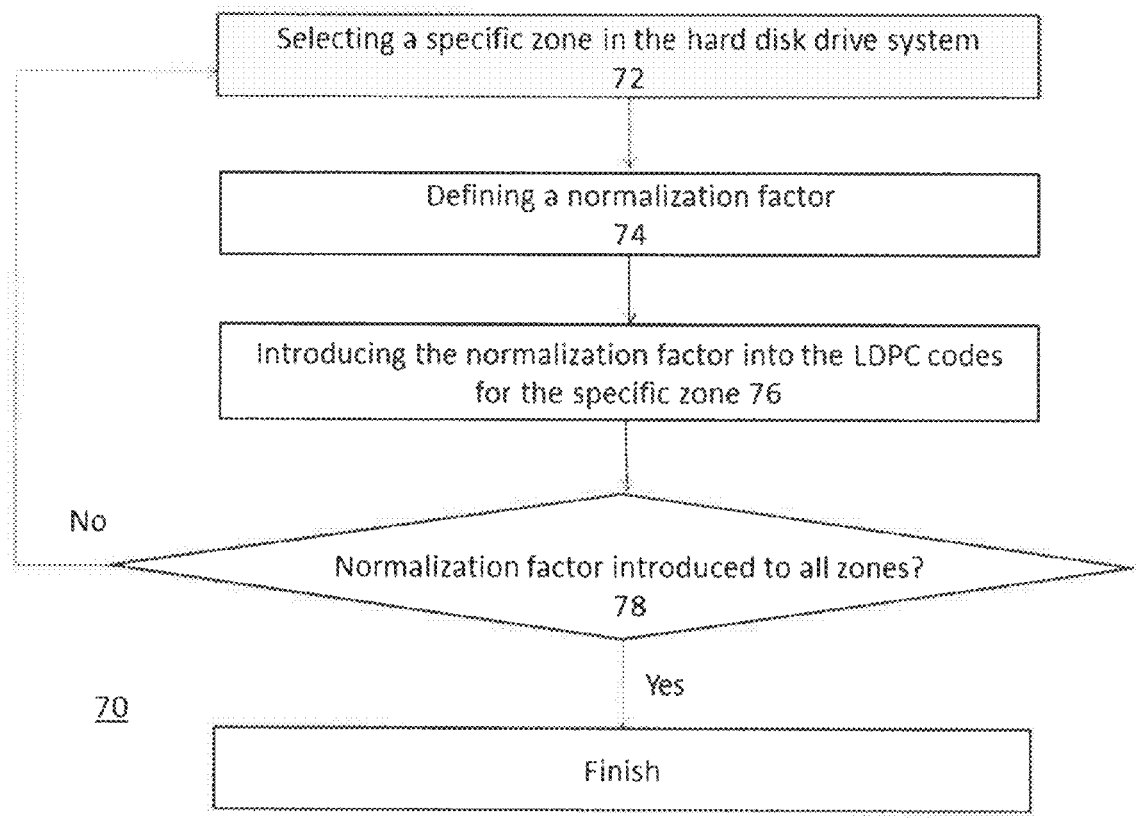
FIG. 7 is a flowchart in accordance with the present embodiment.

Referring to FIG. 7, a flowchart of a method for adapting low-density parity-check (LDPC) codes for a hard disk drive system in accordance with one embodiment is disclosed. The flowchart 70 includes a selecting step 72, a defining step 74, an introducing step 76. The selecting step 72 includes selecting a specific zone in the hard disk drive system. The defining step 74 includes defining a normalization factor which reduces a variation of bit error rate for different signal-to-noise ratio (SNR) based on known pseudo-random data pattern for the specific zone. The introducing step 76 includes introducing the normalization factor into the LDPC codes for the specific zone. After the introducing step, whether or not normalization factor are introduced to all zones are checked (78). If there are zones which are not introduced the normalization factors, the selecting step 72, defining step 74 and introducing step 76 are repeated for each zone in the hard disk drive system.

It should be appreciated that the exemplary embodiments are only examples, and are not intended to limit the scope, applicability, dimensions, or configuration of the invention in any way. Rather, the foregoing detailed description will provide those skilled in the art with a convenient road map for implementing an exemplary embodiment of the invention, it being understood that various changes may be made in the function and arrangement of elements and method of fabrication described in an exemplary embodiment without departing from the scope of the invention as set forth in the appended claims.

REFERENCE NUMERALS

10 Track
12 Zone
14 Sector
20 EbtNo=5.5 dB
22 Eb/No=6.2 dB
24 EbNo=6.4 dB
26 Eb/No=6.6 dB
28 Eb/No=6.8 dB
30 Forward PDNP, LLR with norm. factor $\alpha=0.2$
32 Forward PDNP, LLR with norm. factor $\alpha=0.3$
34 Forward PDNP, LLR with norm. factor $\alpha=0.4$
36 Forward PDNP, LLR with norm. factor $\alpha=0.5$
38 Forward PDNP, LLR with norm. factor $\alpha=0.6$
40 Forward PDNP, LLR with norm. factor $\alpha=0.7$
42 Forward PDNP, LLR with norm. factor $\alpha=0.8$
44 Forward PDNP, LLR with norm. factor $\alpha=0.9$
46 Forward PDNP, LLR with norm. factor $\alpha=1$
50 BiPDNP, averaged LLR with norm. factor $\alpha=0.2$
52 BiPDNP, averaged LLR with norm. factor $\alpha=0.3$
54 BiPDNP, averaged LLR with norm. factor $\alpha=0.4$
56 BiPDNP, averaged LLR with norm. factor $\alpha=0.5$
58 BiPDNP, averaged LLR with norm. factor $\alpha=0.6$
60 BiPDNP, averaged LLR with norm. factor $\alpha=0.7$
62 BiPDNP, averaged LLR with norm. factor $\alpha=0.8$
64 BiPDNP, averaged LLR with norm. factor $\alpha=0.9$
66 BiPDNP, averaged LLR with norm. factor $\alpha=1$
70 A flowchart of introducing normalization factor for each zones
72 Selecting a specific zone in the hard disk drive system
74 Defining a normalization factor
76 Introducing the normalization factor into LDPC codes of the specific zone
78 Checking whether or not normalization factor are introduced to all zones

What is claimed is:

1. A method for adapting low-density parity-check (LDPC) codes for a hard disk drive system comprising:
   selecting a specific zone in a disk media of the hard disk drive system;
   defining a normalization factor for decoding LDPC codes, which reduces a variation of bit error rate for different signal-to-noise ratio (SNR) based on known pseudo-random data pattern for the specific zone;
   introducing the normalization factor into the LDPC codes for the specific zone; and
   repeating the selecting operation, defining operation, and introducing operation for each zone in the disk media of the hard disk drive system.

2. The method in accordance with claim 1, wherein the introducing operation comprises introducing the normalization factor into a check node of LDPC codes.

3. The method in accordance with claim 1, wherein the introducing operation comprises introducing the normalization factor into a bit node of LDPC codes.

4. The method in accordance with claim 1, wherein the introducing operation comprises introducing the normalization factor into the channel log-likelihood ratios ($LLR_s$).

5. The method in accordance with claim 1, wherein the LDPC codes are decoded by a sum-product algorithm (SPA) decoder.

6. The method in accordance with claim 1, wherein the LDPC codes are decoded by a Min-Sum decoder.

7. The method in accordance with claim 1, wherein the selecting operation, defining operation, introducing operation, and repeating operation are performed during a test stage of manufacturing the hard disk drive system.

8. The method in accordance with claim 1, wherein the selecting operation, defining operation, introducing operation, and repeating operation are performed during rereading of manufacturing the hard disk drive system.

9. A method for adapting low-density parity-check (LDPC) codes for hard disk drive system comprising
   selecting a read head of each hard disk drive in the hard disk drive systems;
   defining a normalization factor for decoding LDPC codes, which reduces a variation of bit error rate for different signal-to-noise ratio (SNR) based on a known pseudo-random data pattern for the read head;
   introducing the normalization factor into the LDPC codes for the read head; and
   repeating the selecting operation, defining operation, and introducing operation for each read head in the hard disk drive systems.

10. The method in accordance with claim 9, wherein the introducing operation comprises introducing the normalization factor into a check node of LDPC codes.

11. The method in accordance with claim 9, wherein the introducing operation comprises introducing the normalization factor into a bit node of LDPC codes.

12. The method in accordance with claim 9, wherein the introducing operation comprises introducing the normalization factor into the channel log-likelihood ratios ($LLR_s$).

13. The method in accordance with claim 9, wherein the LDPC codes are decoded by a sum-product algorithm (SPA) decoder.

14. The method in accordance with claim 9, wherein the LDPC codes are decoded by a Min-Sum decoder.

15. The method in accordance with claim 9, wherein the selecting operation, defining operation, introducing operation, and repeating operation are performed during a test stage of manufacturing of the hard disk drive systems.

16. The method in accordance with claim 9, wherein the selecting operation, defining operation, introducing operation, and repeating operation are performed during re-reading of manufacturing of the hard disk drive systems.

* * * * *